United States Patent [19]
Niino et al.

[11] Patent Number: 5,580,616
[45] Date of Patent: Dec. 3, 1996

[54] METHOD FOR SURFACE MODIFYING A FLUOROCARBONPOLYMER

[75] Inventors: Hiroyuki Niino, Tsukuba; Akira Yabe, Tsuchiura, both of Japan

[73] Assignee: Director-General of Agency of Industrial Science and Technology, Tokyo, Japan

[21] Appl. No.: 357,136

[22] Filed: Dec. 15, 1994

Related U.S. Application Data

[63] Continuation of Ser. No. 167,095, Dec. 16, 1993, abandoned.

[30] Foreign Application Priority Data

Dec. 22, 1992 [JP] Japan ..................... 4-356941

[51] Int. Cl.$^6$ ..................................... B05D 3/00
[52] U.S. Cl. ..................... 427/554; 427/304; 427/322; 427/340; 427/443.1; 427/444; 427/558; 427/596; 427/597
[58] Field of Search ..................... 427/554, 558, 427/597, 443.1, 444, 304, 340, 322, 596

[56] References Cited

U.S. PATENT DOCUMENTS 4,096,043  6/1978  De Angelo ................. 204/15

FOREIGN PATENT DOCUMENTS

| | | |
|---|---|---|
| 0478975A2 | 4/1992 | European Pat. Off. . |
| 60-226534 | 11/1985 | Japan . |
| 61-087341 | 5/1986 | Japan . |
| 3269024 | 11/1991 | Japan . |
| 9218320 | 10/1992 | WIPO . |

OTHER PUBLICATIONS

*Chemical Abstracts*, vol. 89, No. 14, Abstract No. 110977, p. 46 (1978) (No month avail.).
H. Niino, et al., Appl. Phys. Lett., vol. 60(21), pp. 2697–2699(May 1992).
M. Morra, et al., Langmuir, vol. 5, pp. 872–876 (1989) No month available.
M. Okoshi, et al., J. Mater. Res., vol. 7(7), pp. 1912–1916 (Jul. 1992).
Hawkins, W. G. and P. L. Houson, Journal of Physical Chemistry, vol. 86, pp. 704–709 (1982) (No month Avail.).

*Primary Examiner*—Bernard Pianalto
*Attorney, Agent, or Firm*—Birch, Stewart, Kolasch & Birch, LLP

[57] ABSTRACT

There is disclosed a method for surface-modifying a fluorocarbonpolymer-molded article and a method for chemical plating the surface. The method for surface-modifying comprises irradiating the fluorocarbonpolymer-molded article with an ultraviolet laser beam having a wavelength of 250 nm or less, in the presence of hydrazine compound, to make a surface of the said fluorocarbonpolymer-molded article hydrophilic. The surface made being hydrophilic is made lipophilic by chemical treating with an organic acid anhydride. The method for chemical plating comprises chemical plating the surface made being hydrophilic by the above method for surface-modifying, to deposit a metal film on a surface of the fluorocarbonpolymer-molded article.

8 Claims, 3 Drawing Sheets

METHOD FOR SURFACE MODIFYING A FLUOROCARBONPOLYMER

This application is a continuation of application Ser. No. 08/167,095 filed on Dec. 16, 1993, now abandoned.

FIELD OF THE INVENTION

The present invention relates to a method for surface-modifying a fluorocarbonpolymer-molded article and a method for chemical plating the surface. More particularly the present invention relates to a new surface-treatment method wherein an ultraviolet laser beam is shed upon a polymer surface in a system containing a gas of a compound such as hydrazines. According to the method, the structural properties and functionality of the polymer surface are improved making the surface that has been irradiated with the laser beam hydrophilic without leaving impurities, such as residue, on the polymer surface. According to the method it is possible to make only the surface that has been irradiated with the laser beam hydrophilic and then lipophilic, in a positionally selected manner. Further, the invention relates to a new method for chemical plating a fluorocarbonpolymer-molded article, to deposit a metal film on the surface that has been made hydrophilic, in a positionally selected manner.

BACKGROUND OF THE INVENTION

Reactions on polymer Surfaces by using an excimer laser, which emits high-intensity pulsed light in the ultraviolet region, are being studied vigorously for fine-surface treatment and fine-surface processing of polymers, aimed at both acquiring basic knowledge and applying such reactions practically.

The present inventors have reported that, by irradiation with a laser beam, (1) a fine structure was formed on the surface of a polymer, which surface can be applied to a liquid crystal alignment film [H. Niino, A. Yabe, et al. *Japan Journal of Applied Physics*, Vol. 28, p. L2225 (1989); *Applied Physics Letters*, Vol. 55, p. 510 (1989); ibid, Vol. 54, p. 2159 (1989); ibid, Vol. 57, p. 2368 (1990); and *Journal of Photochemistry, Photobiology A: Chemistry*, Vol. 65, p. 303 (1992)], and (2) an irradiation-positionally selective electroless plating could be conducted by using a change in surface potential [H. Niino, A. Yabe, et al., Applied Physics Letters, Vol. 60, p. 2697 (1992)]. These are based upon the formation of ion species or a periodic change in surface shape.

W. G. Hawkins et al. [W. G. Hawkins and P. L. Houston, *Journal of Physical Chemistry*, Vol. 86, p. 704 (1982)] attempted photochemical decomposition of hydrazine ($N_2H_4$) in a gaseous phase with irradiation with an ArF excimer laser beam (wavelength: 193 nm), and detected radical species, such as $NH_2$ and $N_2H_3$, and nitrene species, such as NH, as formed intermediates, spectroscopically. Thus, photochemical decomposition reaction of gaseous molecules by using an ultraviolet laser can generate intermediates having high chemical reactivity with high efficiency. However, Hawkins et al. did not at all suggest industrial usefulness and applicable measures regarding the surface-treatment method that uses these intermediates.

On the other hand, fluorocarbonpolymers, typically poly(tetrafluoroethylene), are thermally and chemically highly stable and therefore draw wide industrial interest. However, since fluorocarbonpolymers are very low in surface free energy, their surface exhibits both water repellency and oil repellency, and the adhesion of the surface is poor. As a result, their field of the application is limited in practice. Accordingly, in order to improve the adhesion of their surface keeping the properties of the molded article itself unchanged, introduction of polar groups by various surface-modification processes is being studied. For example, there are reported a method that uses plasma treatment [M. Morra et al., *Langmuir*, Vol. 5, p. 872 (1989)], a chemical activation method that uses a solution of an alkali metal [E. R. Nelson et al., *Industrial and Engineering Chemistry*, Vol. 50, p 329 (1958)], and a laser irradiation method that uses a boron/aluminum/ammonia compound (Toyoda and Murahara, Japanese Patent Application (OPI) No. 196834/1990). These methods are attended with such problems as that the polymer surface is physically damaged; it is difficult to modify the surface locally; and sufficient care must be taken in handling the reagents. Further, these reports did not at all suggest depositing a metal film on the surface that have been irradiated with a laser beam.

SUMMARY OF THE INVENTION

An object of the present invention is to provide a method for making part of a surface of a fluorocarbonpolymer-molded article, in a positionally selective manner, hydrophilic or lipophilic.

Another object of the present invention is to provide a more effective surface-treatment processing method for a synthetic-resin-molded article.

Further, the present invention relates to a photo-surface-processing method for a fluorocarbonpolymer-molded article; the invention is intended to deposit a metal film excellent in adhesion on a surface of the fluorocarbonpolymer-molded article by making hydrophilic, in a positionally selected manner the surface of the fluorocarbonpolymer-molded article, which is low in surface free energy, using the excellent features of photo-processing with irradiation with an ultraviolet laser (laser beam), and then chemical plating the surface. That is, the object of the present invention is to provide a more effective surface-treatment processing method for a synthetic-resin-molded article.

The above and other objects, features, and advantages of the invention will be fully apparent from the following description, taken in connection with the accompanying drawings.

DETAILED DESCRIPTION OF THE INVENTION

Figure 1:
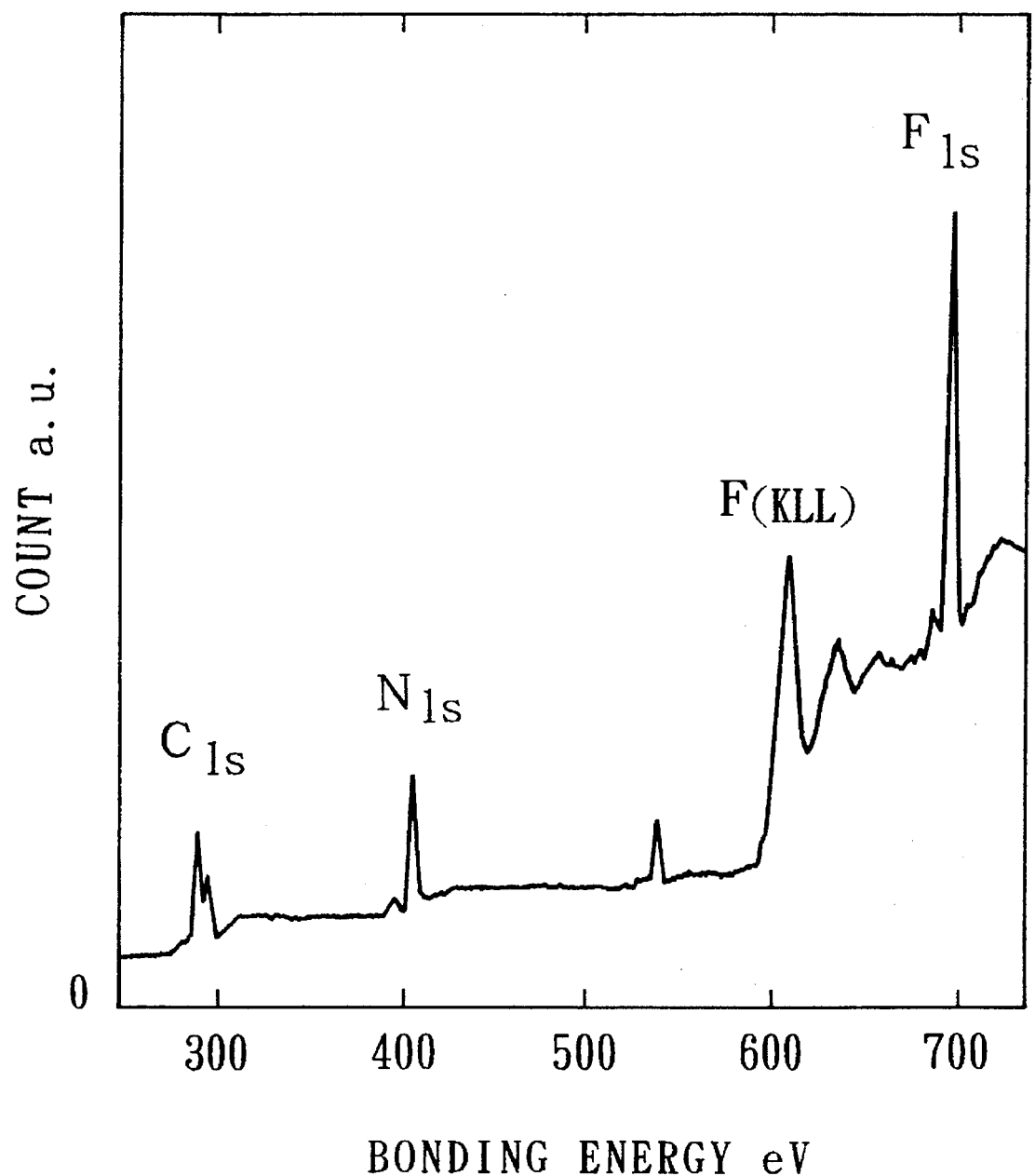
FIG. 1 is the X-ray photoelectron spectroscopy (XPS) spectrum of a poly(tetrafluoroethylene-co-hexafluoropropylene)(FEP) film that was irradiated with an ArF excimer laser beam in an atmosphere of a hydrazine gas, used in Example 1.

The present inventors, having keenly studied in various ways the method for processing a polymer surface by an ultraviolet laser, have found that, when a fluorocarbonpolymer surface is irradiated with an ultraviolet laser beam in a system containing a hydrazine, the fluorine atoms on the surface of the fluorocarbonpolymer are replaced by amino groups, so that only the surface where the laser beam has been shed can be made hydrophilic; and further that, since the surface where the laser beam has been shed has a number of amino groups that have replaced the fluorine atoms, when the surface is chemically treated with an organic acid anhydride, such as acetic anhydride, alkyl groups can be produced on the surface through amide moieties, so that the surface can also be modified to be made lipophilic. Further, it has been found that when, the polymer treated by irradiation with an ultraviolet laser beam is dipped in an aqueous stannous chloride/hydrochloric acid mixed solution and an aqueous palladium chloride solution to activate the surface, and then is dipped in a chemical plating bath, a metal film can be deposited only on the part of the fluorocarbonpolymer surface where the laser beam has been shed, in a positionally selective manner, with good adhesion. The present inventors have further studied variously based upon these findings to attain the present invention.

That is, the present invention provides:

(1) A method for surface-modifying a fluorocarbonpolymer-molded article, which comprises irradiating the fluorocarbonpolymer-molded article with an ultraviolet laser beam having a wavelength of 250 nm or less, in the presence of a hydrazine compound, to make a surface of the said fluorocarbonpolymer-molded article hydrophilic.

(2) The method for surface-modifying a fluorocarbonpolymer-molded article as stated in (1) above, wherein after the fluorocarbonpolymer molded article is irradiated with an ultraviolet laser beam having a wavelength of 250 nm or less, in the presence of the hydrazine compound to make a surface of the said polymer-molded article hydrophilic, the surface is chemically treated with an organic acid anhydride to make the surface lipophilic.

(3) The method for surface-modifying a fluorocarbonpolymer-molded article as stated in (2) above, wherein the organic acid anhydride is acetic anhydride.

(4) The method for surface-modifying a fluorocarbonpolymer-molded article as stated in (1) above, wherein, as the ultraviolet laser beam, an argon fluoride (ArF) excimer laser beam or krypton fluoride (KrF) excimer laser beam is used.

(5) A method for chemical plating a fluorocarbonpolymer-molded article, which comprises irradiating the fluorocarbonpolymer-molded article with an ultraviolet laser beam, in the presence of the hydrazine compound, to make a surface of the said fluorocarbonpolymer-molded article hydrophilic, and then chemically plating the surface, to deposit a metal film on the surface of the fluorocarbonpolymer-molded article.

(6) The method for chemical plating a fluorocarbonpolymer-molded article as stated in (5) above, wherein, as the ultraviolet laser beam, an argon fluoride excimer laser beam or a krypton fluoride excimer laser beam of a wavelength of 250 nm or less is used.

Now the present invention will be described in detail.

In the specification and claims of the present invention, the term "a polymer-molded article" refers to a material among such as films, sheets, fibers, fiber-reinforced resins, and resin-molded articles; it is not required that a polymer-molded article be a molded article in the form of a final product, and the shape thereof is not restricted.

The hydrazine compound for use in the present invention include, for example, hydrazine, hydrazine hydrate, phenylhydrazine, and hydrazine hydrochloride.

The reaction between a fluorocarbonpolymer-molded article and a hydrazine compound is now explained by taking hydrazine as an example of a hydrazine compound: When hydrazine is irradiated with an ultraviolet laser beam, hydrazine in an electronically excited state is produced, and then the electrically excited hydrazine is decomposed into intermediates, such as radicals and nitrenes. Since these intermediates are highly chemically reactive, when a fluorocarbonpolymer-molded article is present in the reaction system, a displacement takes place between the fluorine atoms and the intermediates of a photo-decomposed hydrazine. As a result, on the surface of the molded article, polymer molecular chains having amino groups are produced, and a result is that the surface is made hydrophilic. Herein, hydrophilic property of the surface can be measured by the deacrease of the contact angle of the surface with water. Further, since the life of the intermediates is short, the displacement reaction takes place only at the surface parts where the laser beam is irradiated, so that the amination reaction on the surface takes place in a positionally selective manner. Further, since the amino groups can react with an organic acid anhydride, for example, a fatty acid anhydride, such as acetic anhydride, propionic anhydride, butyric anhydride, arachidic anhydride, stearic anhydride, and trifluoroacetic anhydride, and an aryl acid anhydrous such as benzoic anhydride, to immobilize the alkyl groups through amide moieties, all of the irradiated surface can be made lipophilic.

In the method of the present invention, the intensity of the ultraviolet laser beam is preferably lower than the intensity of the threshold value (about 100 mJ/cm$^2$/pulse or less) at which ablation will occur, and the higher the gas pressure of the hydrazine compound is, the more effective it is (saturated vapor pressure at room temperature: about 9 Torr). In the present invention, the intensity of the ultraviolet laser beam is preferably 100 to 1 mJ/cm$^2$/pulse, more preferably 80 to 10 mJ/cm$^2$/pulse, and most preferably 60 to 40 mJ/cm$^2$/pulse. The gas pressure of the hydrazine compound is 0.1 to 9 Torr, preferably 5 to 9 Torr, at room temperature.

Figure 2:
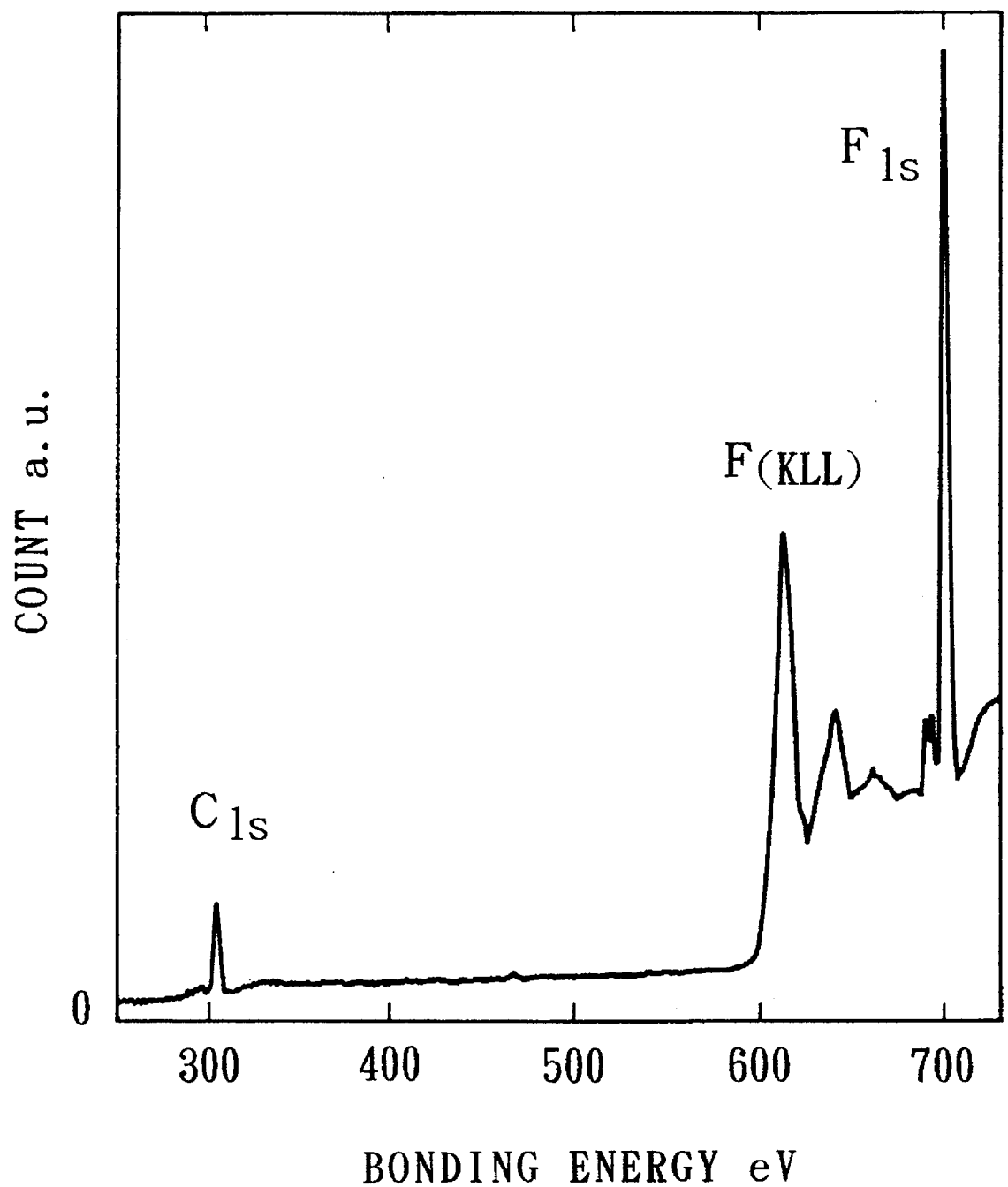
FIG. 2 is the XPS spectrum of the above FEP film before the irradiation with the laser beam, used in Example 1.

It was confirmed by the appearance of a nitrogen peak and decrease of a fluorene peak in X-ray photoelectron spectroscopy (XPS) spectra that, when the surface of a film of a poly(tetrafluoroethylene)(PTFE) or a poly(tetrafluoroethylene-co-hexafluoropropylene)(FEP) was irradiated with an ArF excimer laser beam in a system containing hydrazine, the surface was substituted by amino groups (FIGS. 1 and 2). In comparison with FIG. 2 obtained before irradiation, FIG. 1 obtained after irradiation shows that there appears a nitrogen ($N_{1s}$) peak, and the fluorene ($F_{1s}$) peak is decreased in comparison with the decrease of the carbon ($C_{1s}$) peak. This means that the carbon atoms to which fluorine atoms were bonded before the irradiation with the laser beam became substituted by nitrogen atoms; namely, amino groups. Further, the contact angle of the film with water, which was 130° before the irradiation, was changed to in a range of 90° to 30°, indicating that the surface was made hydrophilic. Thus, it has become possible for the surface of a fluorocarbonpolymer-molded article to be made hydrophilic simply and rapidly by an ultraviolet laser irradiation as described above.

Since the fluorocarbonpolymer-molded article whose surface has been modified with amino groups is increased in surface free energy while retaining unchanged the properties of the bulk, the adhesion of the surface can be improved through the merits of the fluorocarbonpolymer making it possible to enlarge the range of the practical application, which includes, for example, adsorption of dyes, use as medical material, and multiplication-substrates for cells.

Figure 3:
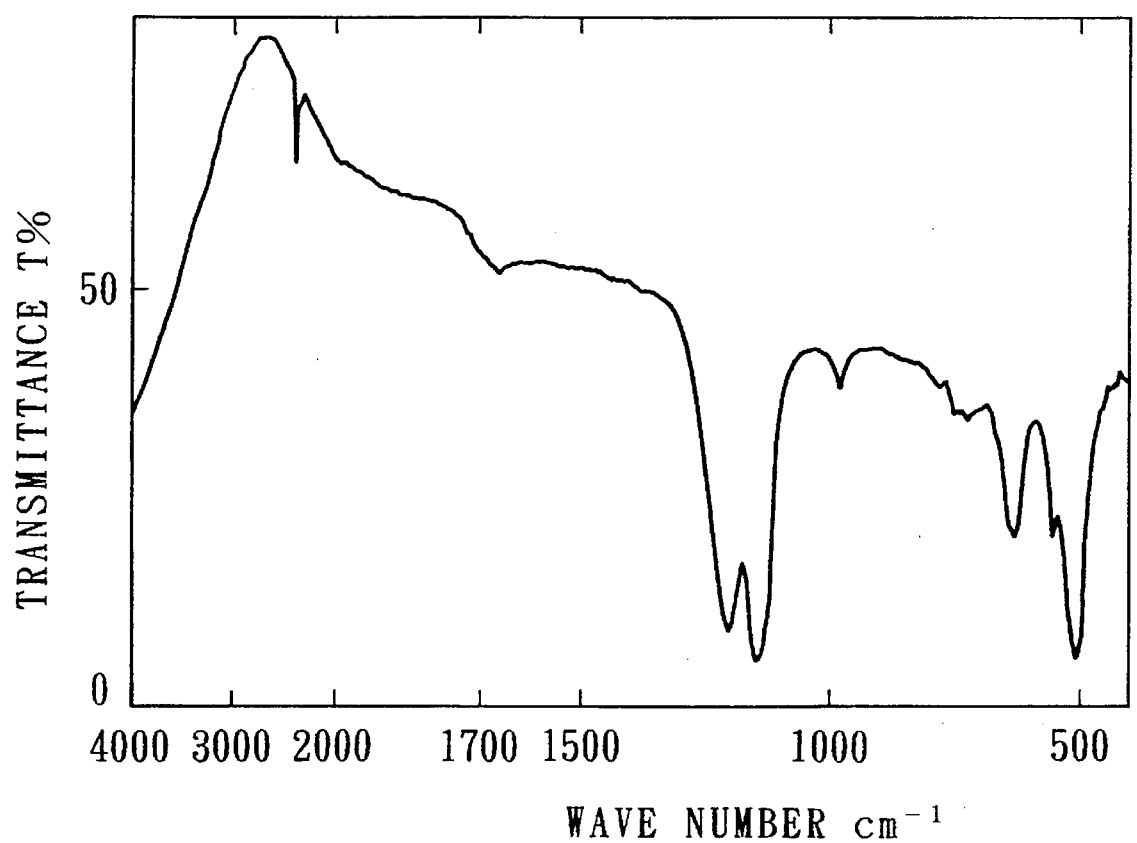
FIG. 3 is the attenuation total reflection Fourier transformation infrared spectroscopic (FTIR-ATR) spectrum of a poly(tetrafluoroethylene-co-hexafluoropropylene) (FEP) film, showing that acetyl groups were introduced onto the surface in Example 3 by irradiating the FEP film, in an atmosphere containing a hydrazine gas, with an ArF excimer laser beam and then treating the FEP film with acetic anhydride.

Functional group conversion by a chemical reaction of the amino groups with some other reagents can be carried out. For example, further chemical treatment with an organic acid anhydride, such as acetic anhydride, adds acetyl groups to the amino groups, so that, due to the effect of the terminal methyl groups, the surface is made lipophilic (FIG. 3). In the attenuation total reflection Fourier transformation infrared spectrum (FTIR-ATR) of FIG. 3, the peak of amide groups (carbonyl groups) appears near 1,700 cm$^{-1}$, indicating that acetyl groups were added.

Further, in the present invention, by irradiating the part of a polymer-molded article surface where modification is desired with a laser beam passed through a mask (e.g., a pattern of a metal plate), only the desired part can be surface-treated. On the other hand, in comparison with the beams of a helium/neon laser, argon and krypton ion lasers, an Nd$^+$:YAG laser, and other lasers, the beam of an ArF or KrF excimer laser has a large shape; and by scanning the beam, the part having a desired shape where modification is desired is irradiated therewith, and thus even a large area can be easily treated. In particular, in the present invention, since hydrazines are reacted by a photochemical reaction by an ultraviolet laser beam, the surface treatment can be carried out quite effectively without causing any thermal damage to the part surrounding the irradiated part.

In the present invention, as the laser, an ultraviolet laser that emits the ultraviolet absorption wavelength of hydrazines is suitable, and in particularly an ArF excimer laser (wavelength: 193 nm) or a KrF excimer laser (wavelength: 248 nm) is preferable. Also effective is a laser beam obtained by harmonics of an Nd$^+$:YAG laser, a dye laser, a Kr ion laser, an Ar ion laser, or a copper vapor laser, into a laser beam in the ultraviolet region of 250 nm or less through use of a nonlinear optical element. Preferably, the range of wavelength of laser beam for use in the present invention is 250 to 190 nm. As the fluence of the laser, a high-intensity laser of about 1 mJ/pulse or over, with the pulse width being on the order of nanoseconds, is desirable, which fluence will vary according to the type of the polymer or the hydrazine.

Further, the fluorocarbonpolymer (synthetic fluorocarbon resin) that will be used in the present invention may be noncrystalline or crystalline, or of an aromatic type or a nonaromatic type, and examples are a poly(tetrafluoroethylene) resin, a poly(hexafluoropropylene) resin, a poly(fluorovinylidene) resin, or a poly(trifluorochloroethylene) resin; a copolymer or a co-condensation polymer, such as a Poly(tetrafluorothylene-co-hexafluoropropylene); or a synthetic resin made up of a mixture of these.

Preferably a closed-type reactor is used for the surface-treatment of the present invention, though an open-type reactor (a flow system reactor) provided an window for irradiating the laser beam, to which reactor a hydrazine gas can be supplied stably, may be used without problems.

Now the positionally selective chemical plating steps are described.

To activate the surface of the fluorocarbonpolymer-molded article that has been subjected to an amination treatment, the article is dipped in an aqueous stannous chloride/hydrochloric acid mixed solution. Since the solution is acidic, the amino groups on the molded article surface are ionized into ammonio groups (R—NH$_3^+$), and chloro complex ions of tin (SnCl$_4^{2-}$) are immobilized on the surface through ionic bonds. Then, after washing with deionized water, the fluorocarbonpolymer-molded article is dipped in an aqueous palladium chloride (PdCl$_2$) solution, to reduce the palladium ions adsorbed on the surface with tin complex ions, thereby depositing a metal palladium colloid on the surface.

After these surface-activating steps, by dipping the molded article in a chemical plating bath containing the metal ion with which the molded article will be plated, a metal film can be deposited only on the part where the laser beam has been irradiated, with the metal palladium colloid on the surface serving as catalytic sites. In the present invention, as the metal ion that is used in the plating bath for the formation of the metal film, nickel, copper, cobalt, and gold are preferable.

Example of metal-plated film deposited in a positionally selected manner in the above way on the surface where the laser beam had been shed was glossy, and since it was good in adhesion on the molded article surface, the metal film was not peeled off in the peeling test, wherein an adhesive tape is used. Further, since the plated film is electrically conductive, an usual electroplating can be made thereon, so that the plated film can be formed into harder metal film.

According to the present invention, the method for treating the surface of a fluorocarbonpolymer-molded article using an ultraviolet laser can make the surface hydrophilic quite effectively, precisely, and uniformly, by introducing amino groups only at the part where a pattern is formed with irradiation with a laser beam, since the laser beam is excellent in energy and position-controllability.

According to the present invention, the amino groups formed on the surface of the fluorocarbonpolymer-molded article can undergo an addition reaction with acetyl groups by a chemical treatment with an organic acid anhydride, so that the surface can be treated to be made lipophilic at only the part where a pattern is formed with irradiation with a laser beam. Further, according to the present invention, by chemically plating the said activated surface, a metal-plated film can be deposited only on the part where a pattern has been formed by the irradiation with the laser beam.

Now the present invention will be described in detail with reference to the following Examples.

EXAMPLE 1

A poly(tetrafluoroethylene-cohexafluoropropylene)(FEp) film was set in a closed-type reactor and was irradiated at room temperature, under an atmosphere of hydrazine (9 Torr), with 1,000 pulses of an ArF excimer laser beam, with the intensity being 50 mJ/cm$^2$/pulse, thereby obtaining a surface-treated film. By the irradiation with the laser beam, the contact angle of the film with water was decreased from 130° to 30°, which indicated that the surface was made hydrophilic. It was also confirmed that amino groups were introduced onto the surface, since the X-ray photoelectron spectroscopic measurement (XPS) after the irradiation of laser beam showed the appearance of an N$_{1s}$ peak and a decrease of the F$_{1s}$ peak (FIGS. 1 and 2).

EXAMPLE 2

A poly(tetrafluoroethylene) (PTFE) film was set in a closed-type reactor and was irradiated at room temperature, under an atmosphere of hydrazine (9 Torr), with 1,000 pulses of an ArF excimer laser beam, with the intensity being 50 mJ/cm$^2$/pulse, thereby obtaining a surface-treated film. By the irradiation with the laser beam, the contact angle of the film with water was decreased from 130° to 90°, which indicated that the surface was made hydrophilic. It was also confirmed that amino groups were introduced onto the surface, since the X-ray photoelectron spectroscopic measurement (XPS) showed the appearance of an $N_{1s}$ peak and a decrease of the $F_{1s}$ peak.

EXAMPLE 3

The FEP film whose surface had been aminated in Example 1 was set in a closed-type reactor and was exposed to a vapor of acetic anhydride at room temperature for 10 min. Thereafter, the attenuation total reflection Fourier transformation infrared spectroscopy (FTIR-ATR) spectrum was measured, and it was found that the absorption of carbonyl groups appeared near 1,700 cm$^{-1}$, indicating that acetyl groups were introduced on the surface (FIG. 3). Further, lipophilic nature was observed, since the contact angle of the film with hexane, which was 20° before the laser treatment, was decreased to 2° to 4° after the laser treatment.

EXAMPLE 4

A poly(tetrafluoroethylene-co-hexafluoropropylene) (FEP) film was set in a closed-type reactor and was irradiated at room temperature, under an atmosphere saturated with hydrazine hydrate, with 1,000 pulses of a laser beam from an ArF excimer laser, with the intensity being 50 mJ/cm$^2$/pulse, thereby obtaining a surface-treated film. By the irradiation with the laser beam, the contact angle of the film with water was decreased from 130° to 40°, which indicated that the surface was made hydrophilic.

EXAMPLE 5

To activate the surface of the FEP film aminated by the same manner as in Example 1, the FEP film was first dipped in an aqueous stannous chloride/hydrochloric acid mixed solution for several seconds to 1 min, and then, after washing it with water, the FEP film was dipped in an aqueous palladium chloride (PdCl$_2$) solution for several minutes. After these surface-activating steps, when the FEP film was dipped in a chemical plating bath of nickel or copper, a nickel or copper metal film was deposited, in a positionally selective manner, only on the part where the laser bean had been shed.

The thus produced metal-plated film was subjected to the peeling test using an adhesive tape (a mending tape (M-18), manufactured by 3M Co., U.S.A.). As a result, it was found that the metal film was not peeled off and the adhesion to the polymer surface was excellent.

EXAMPLE 6

To activate the surface of the PTFE film that had been aminated by the same manner as in Example 2, the PTFE film was first dipped in an aqueous stannous chloride/ hydrochloric acid mixed solution for a few seconds to 1 min, and then, after washing it with water, the PTFE film was dipped in an aqueous palladium chloride (PdCl$_2$) solution for a few minutes. After these surface-activating steps, when the PTFE film was dipped in a chemical plating bath of nickel or copper, a nickel or copper metal film was deposited, in a positionally selective manner, only on the part where the laser bean had been shed.

The thus produced metal-plated film was subjected to the peeling test similarly to Example 5. As a result, it was found that the metal film was not peeled off and the adhesion to the polymer surface was excellent.

Having described our invention as related to the present embodiments, it is our intention that the invention not be limited by any of the details of the description, unless otherwise specified, but rather be construed broadly within its spirit and scope as set out in the accompanying claims.

What we claim is:

1. A method for surface-modifying a fluorocarbonpolymer-molded article, which comprises irradiating a fluorocarbonpolymer-molded article with an ultraviolet laser beam having a wavelength of 250 nm or less, in the presence of at least one hydrazine compound in a gaseous state, to make a surface of the said fluorocarbonpolymer-molded article hydrophilic.

2. The method for surface-modifying a fluorocarbonpolymer-molded article, which comprises, after the fluorocarbonpolymer-molded article is irradiated with an ultraviolet laser beam having a wavelength of 250 nm or less, in the presence of at least one hydrazine compound, in a gaseous state to make a surface of the said polymer-molded article hydrophilic, by the method as claimed in claim 1, the surface is chemically treated with an organic acid anhydride, to make the surface lipophilic.

3. The method for surface-modifying a fluorocarbonpolymer-molded article as claimed in claim 2, wherein the organic acid anhydride is acetic anhydride.

4. The method for surface-modifying a fluorocarbonpolymer-molded article as claimed in claim 1, wherein, as the ultraviolet laser beam, an argon fluoride excimer laser beam or a krypton fluoride excimer layer beam is used.

5. The method for surface-modifying a fluorocarbonpolymer-molded article as claimed in claim 1, wherein the hydrazine compound is selected from the group consisting of hydrazine, hydrazine hydrate, phenylhydrazine, and hydrazine hydrochloride.

6. A method for chemical plating a fluorocarbonpolymer-molded article, which comprises irradiating a fluorocarbonpolymer-molded article with an ultraviolet laser having a wavelength of 250 nm or less, in the presence of at least one hydrazine compound in a gaseous state, to make a surface of the said fluorocarbonpolymer-molded article hydrophilic, and then chemical plating the surface, to deposit a metal film on the said surface of the said fluorocarbonpolymer-molded article.

7. The method for chemical plating a fluorocarbonpolymer-molded article as claimed in claim 6, wherein, as the ultraviolet laser beam, an argon fluoride excimer laser beam or a krypton fluoride excimer laser beam of a wavelength of 250 nm or less is used.

8. The method for chemical plating as claimed in claim 6, wherein the hydrazine compound is selected from the group consisting of hydrazine, hydrazine hydrate, phenylhydrazine, and hydrazine hydrochloride.

* * * * *